United States Patent Office 3,436,658
Patented Apr. 1, 1969

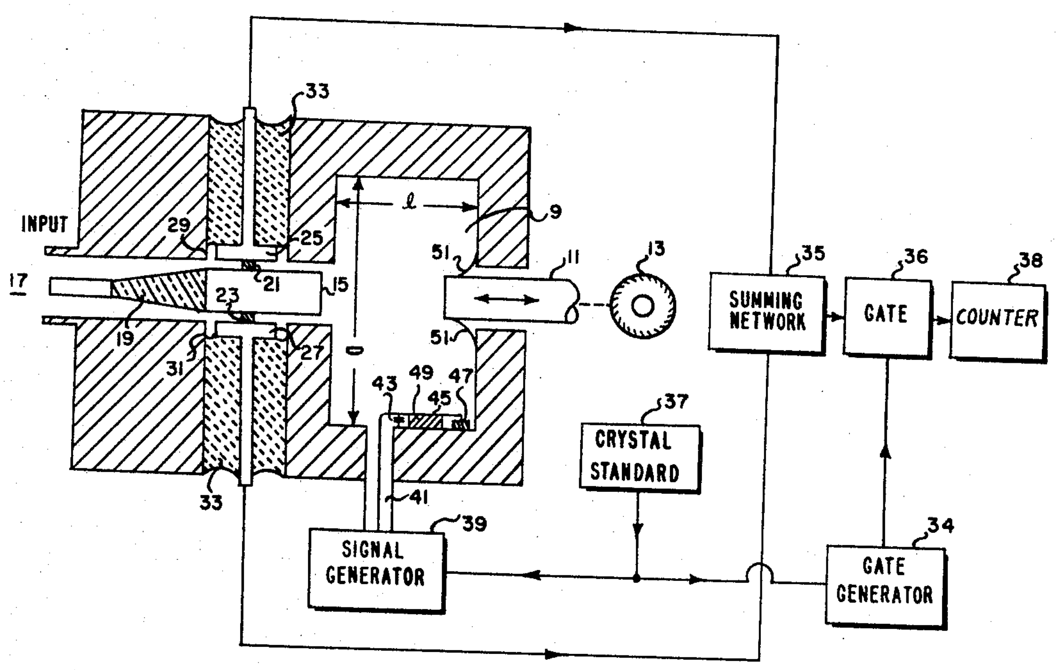
INVENTOR
RICHARD D. PERING
BY
Q. C. Smith
ATTORNEY

3,436,658

SIGNAL FREQUENCY CONVERTER HAVING A CAVITY FILTER AND MIXER

Richard D. Pering, Palo Alto, Calif., assignor to Hewlett-Packard Company, Palo Alto, Calif., a corporation of California Filed Oct. 28, 1965, Ser. No. 505,562
Int. Cl. G01r 23/14
U.S. Cl. 324—79 4 Claims

ABSTRACT OF THE DISCLOSURE

A high frequency converter includes a cavity filter and mixer which receives an input signal frequency and a driving frequency for producing output modulation products from the input signal frequency and a harmonic of the driving signal that is selectable according to a substantially linear relationship between cavity resonance and translational position of a tuning plunger.

The main object of the invention is to provide improved apparatus for producing a beat frequency output within a limited frequency as the difference between the applied signal frequency and the resonant frequency of a calibrated cavity resonator. This is accomplished in accordance with the illustrated embodiment of the present invention using a pair of diodes which receive the applied signal and a signal from a cavity resonator that is coupled to a harmonic generator. The signal from the diodes includes the desired beat frequency signal which may be counted directly to provide an indication of the applied signal frequency.

The accompanying drawing is a schematic diagram of one embodiment of the invention and shows a resonant cavity structure 9 with a tuning plunger 11 suitably connected to a mechanical dial 13 to undergo translational motion into and out of the cavity as the dial 13 is rotated. The cavity 9 resonates at harmonics of the signal frequency applied to the cavity from the signal generator 39 which receives the standard frequency from crystal standard 37. Generator 39 may include a frequency multiplier which is phase locked to crystal standard 37 for applying a sine wave voltage along line 41 to one end of strip line conductor 45 at a frequency, say 200 times greater than the frequency, typically 1 megacycle, from crystal standard 37. The other end of strip line conductor 45 is connected to a semiconductor step-recovery diode chip 47. This type of diode is believed to store carriers in the immediate vicinity of its junction during forward conduction on one half cycle of the sine wave signal, say 200 megacycles, from generator 39. Thus the diode 47 continues to conduct during the reverse conduction of current through it on the other half cycle of signal from generator 39 as these stored carriers are depleted and then shows an abrupt change in the reverse conductivity in response to the sudden depletion of the carrier stored therein. This produces a sharp wavefront having a rise time of the order of 50 picoseconds or less which is thus rich in high frequency harmonics. These high frequency components of the wavefront are electromagnetically coupled into the cavity 9 by the circuit loop formed within the cavity by capacitor 43, strip line conductor 45 and step recovery diode 47. The area of this coupling loop is determined by the length of strip line conductor 45 between diode 47 and capacitor 43 and by the thickness of dielectric support 49 for conductor 45. Capacitor 43 is chosen to show high impedance at the 200 megacycle drive signal but to show very low impedance at the cavity resonant frequency. The desired harmonic frequency component of the sharp wavefront is selected by altering the position of plunger 11 to tune the resonance of cavity 9 to the selected harmonic frequency component. The diameter D of the cavity determines the upper resonant frequency and is typically about .646 inch for an upper frequency of 12.8 to 13 gigacycles. The ratio of the length *l* of the cavity to the diameter D is chosen to provide optimum linearity of frequency change with plunger position and *l* is typically within about 10% of half the dimension of D or .336 inch in practice. Fingers 51 provide sliding ground connection to the plunger 11.

Signal at the resonant frequency of the cavity is electrostatically coupled out of the cavity by element 15. Applied signal, the frequency of which is to be measured, appearing at input 17 is applied to element 15 through resistor 19 which is tapered to minimize reflections on the input signal line. Diodes 21 and 23 connected to element 15 at a point thereon less than a quarter wavelength at the maximum input frequency from the cavity end, operate as non-linear elements for mixing the input signal and the signal from the resonating cavity. These diodes may be poled for series conduction in the same direction and may be biased by network and supply 35 to operate in the square law region with forward conductivities of about 20 ohms. The two diodes in parallel thus constitute a low impedance relative to the impedance of cavity 9 at a frequency off resonance so that substantially the entire input signal is conducted by the diodes. Resistor 19 of about 40 ohms is provided to match the input signal line, typically of 50 ohms characteristic impedance, to the parallel conductive diodes 21, 23. Also, the signal from cavity 9 coupled to element 9 is conducted substantially entirely through the diodes 21, 23 since the impedance "looking" toward the input is much higher than the impedance of the parallel conductive diodes 21, 23 and includes the 40 ohm resistor 19 and the characteristic impedance of the input signal line. These two signals are mixed by diodes 21, 23 to yield a number of modulation products including the difference frequency of the combined signals from the input 17 and from the cavity 9. This difference frequency, typically as high as 200 megacycles, is relatively unaffected by the capacitors formed by the facing surfaces of the mounts 25, 27 and the adjacent side walls 29, 31 or by the polyiron energy dissipative material 33 which holds supports 25, 27 in place. Higher frequency modulation products, however, are filtered out leaving at the output of the summing network and bias supply 35 only the desired difference or beat frequency between the input signal to be measured and the cavity resonant frequency.

This beat frequency output is applied through gate 36 to a counter 38 which compiles and displays the total number of signal repetitions applied thereto during a gate period. This gate period is accurately controlled by gate generator 34 which receives the standard frequency from source 37 and produces a gate-controlling pulse having a width which is equal to a selected member of repetitions of the standard frequency signal. By properly selecting this gate period, the input signal frequency may be read off directly from scale 13 combined with the number displayed by counter 38.

I claim:

1. High frequency signalling apparatus comprising:
a cavity structure coupled to receive a driving signal for resonating at a selected harmonic of said driving signal;
mixing means for combining signals applied thereto to produce modulation products;
means electrostatically coupling signal energy from said cavity to said mixing means;

an input port disposed to receive an applied signal;

means coupling signal appearing at said input port to said mixing means;

said mixing means including at least one diode connected to the means for coupling energy out of the cavity at a point thereon which is less than one quarter wavelength from the cavity end thereof at the highest frequency appearing at said input port; and a utilization circuit responsive to a modulation product produced by said mixing means for providing an indication related to the frequency of an applied signal appearing at said input port.

2. Apparatus as in claim 1 wherein:

said cavity includes a plunger disposed to move translationally therewithin for altering the resonant frequency of said cavity; and the ratio of the diameter of the cavity to its length is approximately 2:1.

3. Apparatus as in claim 1 wherein:

resistive means couples signal appearing at said input port to said mixing means.

4. Apparatus as in claim 2 wherein:

said plunger and said means for coupling energy out of said cavity are coaxially disposed along the central axis of said cavity at opposite ends thereof; and said plunger is movable along said central axis away from and toward said means for coupling energy out of said cavity.

References Cited

UNITED STATES PATENTS

| | | | |
|---|---|---|---|
| 2,738,462 | 3/1956 | Troxel | 324—79 |
| 2,900,601 | 8/1959 | Corl et al. | 324—79 |
| 2,982,922 | 5/1961 | Wilson | 328—16 X |
| 3,085,205 | 4/1963 | Sante | 328—16 |
| 3,304,504 | 2/1967 | Horlander. | |

RUDOLPH V. ROLINEC, *Primary Examiner.*

P. F. WILLE, *Assistant Examiner.*

U.S. Cl. X.R.

328—16; 331—42